(12) United States Patent
Yang et al.

(10) Patent No.: US 12,550,476 B2
(45) Date of Patent: Feb. 10, 2026

(54) DOUBLE-SIDED SOLAR CELL AND MANUFACTURING METHOD THEREFOR

(71) Applicant: TONGWEI SOLAR (MEISHAN) CO., LTD., Sichuan (CN)

(72) Inventors: Tanghui Yang, Meishan (CN); Guoqiang Xing, Meishan (CN); Yongjie Wang, Meishan (CN)

(73) Assignee: TONGWEI SOLAR (MEISHAN) CO., LTD., Sichuan (CN)

( * ) Notice: Subject to any disclaimer, the term of this patent is extended or adjusted under 35 U.S.C. 154(b) by 0 days.

(21) Appl. No.: 18/705,849

(22) PCT Filed: Aug. 24, 2023

(86) PCT No.: PCT/CN2023/114696
§ 371 (c)(1),
(2) Date: Apr. 29, 2024

(87) PCT Pub. No.: WO2024/060927
PCT Pub. Date: Mar. 28, 2024

(65) Prior Publication Data
US 2025/0006852 A1   Jan. 2, 2025

(30) Foreign Application Priority Data
Sep. 21, 2022 (CN) .......... 202211151857.4

(51) Int. Cl.
*H10F 77/20* (2025.01)
*H10F 10/14* (2025.01)
*H10F 77/30* (2025.01)

(52) U.S. Cl.
CPC ......... *H10F 77/215* (2025.01); *H10F 10/148* (2025.01); *H10F 77/315* (2025.01)

(58) Field of Classification Search
CPC .... H10F 77/215; H10F 77/315; H10F 10/148; H10F 10/14
See application file for complete search history.

(56) References Cited

U.S. PATENT DOCUMENTS

| | | | | |
|---|---|---|---|---|
| 5,397,400 A | * | 3/1995 | Matsuno | H10F 71/121 257/466 |
| 2010/0029077 A1 | * | 2/2010 | Barr | C25D 5/024 257/E21.295 |

(Continued)

FOREIGN PATENT DOCUMENTS

| | | |
|---|---|---|
| CN | 104838809 A | 8/2015 |
| CN | 104966761 A | 10/2015 |

(Continued)

OTHER PUBLICATIONS

English Machine Translation of CN 104966761A (Year: 2015).*

(Continued)

*Primary Examiner* — Kourtney R S Carlson
(74) *Attorney, Agent, or Firm* — Dority & Manning, PA

(57) ABSTRACT

In one aspect, a preparation method for a double-sided solar cell includes: preparing a semi-finished product of the double-sided solar cell, the semi-finished product including a silicon wafer, and a P-type doped layer, a front passivation layer, and a front anti-reflection layer that are sequentially formed on a front surface of the silicon wafer; providing an opening corresponding to a front finger on a front surface of the semi-finished product, the opening extending through the front anti-reflection layer and the front passivation layer in sequence and exposing a surface of the P-type doped layer; and coating a non-fire-through paste in contact with the P-type doped layer through the opening, sintering the paste, to form the front finger. This preparation method can increase the open circuit voltage of the double-sided solar (Continued)

cell, and improve the conversion efficiency of double-sided solar cell.

10 Claims, 2 Drawing Sheets

(56) References Cited

U.S. PATENT DOCUMENTS

| | | |
|---|---|---|
| 2011/0140226 A1 | 6/2011 | Jin et al. |
| 2020/0058806 A1* | 2/2020 | Sperlich ............... H10F 77/247 |

FOREIGN PATENT DOCUMENTS

| | | |
|---|---|---|
| CN | 105742378 A | 7/2016 |
| CN | 106356431 A | 1/2017 |
| CN | 106847374 A | 6/2017 |
| CN | 110047952 A | 7/2019 |
| CN | 212100939 U | 12/2020 |
| CN | 113070891 A | 7/2021 |
| CN | 113257956 A | 8/2021 |
| CN | 113362981 A | 9/2021 |
| CN | 115440849 A | 12/2022 |
| JP | 2009166181 A | 7/2009 |

OTHER PUBLICATIONS

English Machine Translation of CN105742378A (Year: 2016).*
International Search Report and Written Opinion (with English Translation) received in corresponding Application No. PCT/CN2023/114696, dated Nov. 3, 2023, 13 pages.
First Chinese Office Action (w/ English Translation) for corresponding Application No. 202211151857.4, dated May 24, 2024, 11 pages.
Second Chinese Office Action (w/ English Translation) for corresponding Application No. 202211151857.4, dated Sep. 19, 2024, 16 pages.
Extended European Search Report received in corresponding Application No. EP 23844160.4, dated Oct. 9, 2025, 10 pages.
Search Report received in corresponding Application No. CN 2022114968794, dated Aug. 4, 2025, 2 pages.

* cited by examiner

DOUBLE-SIDED SOLAR CELL AND MANUFACTURING METHOD THEREFOR

CROSS-REFERENCE TO RELATED APPLICATIONS

This application is a U.S. national phase application under 35 U.S.C. § 371 based upon international patent application No. PCT/CN2023/114696, filed on Aug. 24, 2023, which itself claims priority to China Patent Application No. 202211151857.4, entitled "DOUBLE-SIDED SOLAR CELL AND PREPARATION METHOD THEREOF", filed on Sep. 21, 2022, the content of which is hereby incorporated by reference in its entirety.

TECHNICAL FIELD

The present application relates to the field of solar cells, and in particular, to a double-sided solar cell and a preparation method thereof.

BACKGROUND

Currently, when forming front and back electrodes of a double-sided solar cell, such as a tunnel oxide passivated contact (TOPCon) double-sided solar cell, screen printing is adopted, with a printing path being from a back silver busbar to a back silver fine grid, to a front silver busbar, to a front silver-aluminum fine grid. The TOPCon double-sided solar cell prepared by the above method have the problems of low open circuit voltage (Uoc) and low conversion efficiency.

SUMMARY

The present application provides a double-sided solar cell and a preparation method thereof, which can alleviate the problems of low open circuit voltage and low conversion efficiency of conventional double-sided solar cells, especially TOPCon double-sided solar cells.

Embodiments of the present application are implemented as follows.

In a first aspect, an example of the present application provides a preparation method for a double-sided solar cell, which includes the following steps:

preparing a semi-finished product of the double-sided solar cell, the semi-finished product including a silicon wafer, and a P-type doped layer, a front passivation layer, and a front anti-reflection layer that are sequentially formed on a front surface of the silicon wafer;

providing an opening corresponding to a front finger on a front surface of the semi-finished product, the opening extending through the front anti-reflection layer and the front passivation layer in sequence and exposing a surface of the P-type doped layer; and coating a non-fire-through paste in contact with the P-type doped layer through the opening, sintering the paste, to form the front finger.

The preparation method for a double-sided solar cell according to this application provides the opening on the front passivation layer and the front anti-reflection layer before printing the finger on the front surface of the cell, and then prints the non-fire-through paste, so that the non-fire-through paste can be in direct contact with the P-type doped layer, thereby effectively reducing the contact resistance. In addition, since the non-fire-through paste contains less the glass powder, the pn junction will not be damaged, which can increase the open circuit voltage of the double-sided solar cell, and improve the conversion efficiency of double-sided solar cell.

In some optional embodiments, the non-fire-through paste contains a glass powder with a mass percentage greater than 0 and no more than 1.5%.

Within the above range, due to the low content of the glass powder, the pn junction can be avoided from being damaged by excessive glass powder.

Optionally, the non-fire-through pastes includes a silver-aluminum paste.

In the above implementation process, the conversion efficiency of silver-aluminum paste is high. The preparation method according to this application can be adopted so that the aluminum pin is pinned into the silicon wafer instead of forming an aluminum-silicon alloy, which can further reduce the contact barrier and improve the conversion efficiency of the double-sided solar cell.

Optionally, the double-sided solar cell is a TOPCon double-sided solar cell.

In some optional embodiments, the step of providing the opening corresponding to the front finger on the front surface of the semi-finished product includes: to providing the opening on the front surface of the semi-finished product using laser ablation.

In the above implementation process, the method of providing the opening by laser ablation is simple to operate and has high precision, so that the opening can be quickly obtained, and production efficiency can be improved.

Optionally, a size of a laser spot used in the laser ablation is greater than 0 and no more than 60 μm.

In the above implementation process, since a width of the front finger is smaller, the size of the above laser spot is selected reasonably, which can avoid excessive width of the opening caused by excessive size of the laser spot, and thus avoid excessive exposure of the P-type dopant layer, which in turn avoids low conversion efficiency of the double-sided solar cell.

In some optional embodiments, the step of providing the opening corresponding to the front finger on the front surface of the semi-finished product includes:

forming a patterned anti-acid-corrosion mask layer on a surface of the front anti-reflection layer, a portion of the anti-acid-corrosion mask layer corresponding to the front finger being provided with a hollow portion exposing the front anti-reflective layer, and acid etching the front anti-reflective layer and the front passivation layer corresponding to the hollow portion, and removing the anti-acid-corrosion mask layer.

In the above implementation process, the opening is prepared using an anti-acid-corrosion mask layer, which is simple to operate and convenient for industrial production, and can effectively improve production efficiency.

In some optional embodiments, the step of providing the opening corresponding to the front finger on the front surface of the semi-finished product includes:

printing an etching paste on a portion of a surface of the front anti-reflection layer corresponding to the front finger.

In the above implementation process, the etching paste directly etches, and the operation method is simple and controllable.

In some optional embodiments, the silicon wafer is an N-type silicon wafer.

In the above implementation process, the silicon wafer is arranged to be an N-type silicon wafer, which is beneficial to improving the efficiency of the double-sided solar cell.

In some optional embodiments, the front anti-reflection layer includes a silicon nitride layer or a silicon dioxide layer.

In some optional embodiments, the front passivation layer includes an aluminum oxide layer or a magnesium fluoride layer.

In a second aspect, an example of this application provides a double-sided solar cell, which includes: a silicon wafer, and a P-type doped layer, a front passivation layer, a front anti-reflection layer, and a front electrode that are sequentially formed on a front surface of the silicon wafer. The double-sided solar cell is provided with an opening that sequentially extends through the front anti-reflection layer and the front passivation layer and exposes a surface of the P-type doped layer. The front electrode comprises a front finger. The front finger is formed in the opening and in an ohmic contact with the P-type doped layer. The front finger is a non-fire-through front finger.

The above-mentioned double-sided solar cells have better open circuit voltage and better conversion efficiency.

In some optional embodiments, the front finger is made from a silver-aluminum paste containing a glass powder with a mass content greater than 0 and no more than 1.5%, and an aluminum pin in the front finger is pinned into the silicon wafer.

In the above implementation process, since the aluminum pin is pinned into the silicon wafer instead of forming an aluminum-silicon alloy, the contact barrier can be further reduced and the conversion efficiency of the double-sided solar cell can be improved.

BRIEF DESCRIPTION OF THE DRAWINGS

In order to illustrate the technical solution of the present application more clearly, the drawings used in the present application will be briefly introduced below. Apparently, the drawings described below illustrate only some embodiments of the present application. For those of ordinary skill in the art, other drawings can be obtained based on the drawings without exerting creative efforts.

Figure 1:
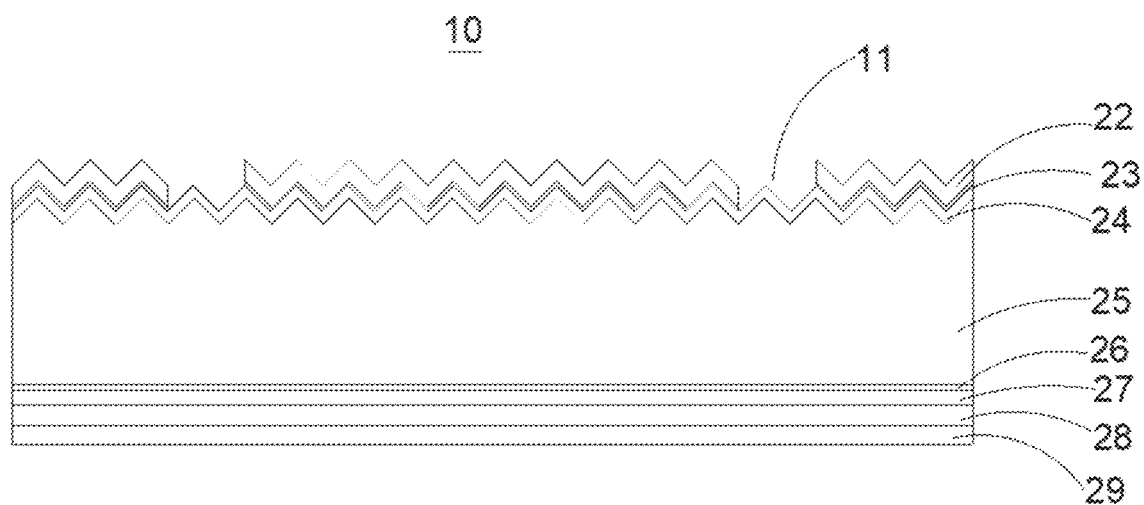
FIG. 1 is a schematic view of a semi-finished product according to the present application.

Description of the drawings: 100—double-sided solar cell; 10—semi-finished product; 11—opening; 21—front electrode; 22—front anti-reflection layer; 23—front passivation layer; 24—P-type doped layer; 25—silicon wafer; 26—tunnel oxide layer; 27—intrinsic polysilicon layer; 28—doped polysilicon layer; 29—back anti-reflection layer; 30—back electrode.

DETAILED DESCRIPTION OF THE EMBODIMENTS

In order to facilitate understanding of the present application, the present application will be described more fully below with reference to the relevant drawings. The preferred embodiments of the present application are shown in the accompanying drawings. However, the present application may be implemented in many different forms and is not limited to the embodiments described herein. Rather, these embodiments are provided to give a thorough understanding of the disclosure of the present application.

Unless otherwise defined, all technical and scientific terms used herein have the same meaning as commonly understood by one of ordinary skill in the technical field to which this application belongs. The terminology used herein in the description of the application is for the purpose of describing specific embodiments only and is not intended to limit this application. As used herein, the term "and/or" includes any and all combinations of one or more of the associated listed items.

Currently, a front passivation layer 23 and a front anti-reflection layer 22 are provided on a front surface of a double-sided solar cell 100, such as a tunnel oxide passivated contact (TOPCon) double-sided solar cell. Since the passivation film is thicker and the anti-reflection film is dense and they are difficult to fire through, a front silver-containing paste used during the production process, such as a silver-aluminum paste or a silver paste, contains glass powder with a mass percentage more than 3%. The high-content glass powder can cause the front passivation layer 23 and the front anti-reflection layer 22 to be fired through, and then a good ohmic contact with a P-type doped layer 24 is formed. However, due to the fact that the thickness of the front film layers of the entire cell is not completely uniform, when the high-content glass powder is fired through regions where the front passivation layer 23 and the front anti-reflection layer 22 are located, a portion of pn junction will be inevitably damaged, resulting in a large amount of metal recombination on the surface of the solar cell, low open circuit voltage, and low conversion efficiency.

In order to solve the above problems, the inventor adopts a method of: before printing a finger on a front surface of the double-sided solar cell 100, providing an opening 11 corresponding to the front finger on a surface of the front anti-reflection layer 22 in advance, such that the opening sequentially extends through the front anti-reflection layer 22 and the front passivation layer 23, and exposes a surface of a P-type doped layer 24; and then coating a silver-containing paste in direct contact with the P-type doped layer 24 through the opening 11, which can reduce the contact resistance. Through this method, the content of glass powder in the silver-containing paste can be effectively reduced, so that after sintering, not only a front finger in a good ohmic contact with the P-type doped layer 24 can be formed, the high-content glass powder can also be prevented from damaging the pn junction due to the content of glass powder being significantly reduced, thereby effectively reducing metal recombination, increasing the open circuit voltage of the double-sided solar cell 100 and improving the conversion efficiency of the double-sided solar cell 100.

A double-sided solar cell 100 and a preparation method thereof according to embodiments of the present application will be described in detail below.

Figure 2:
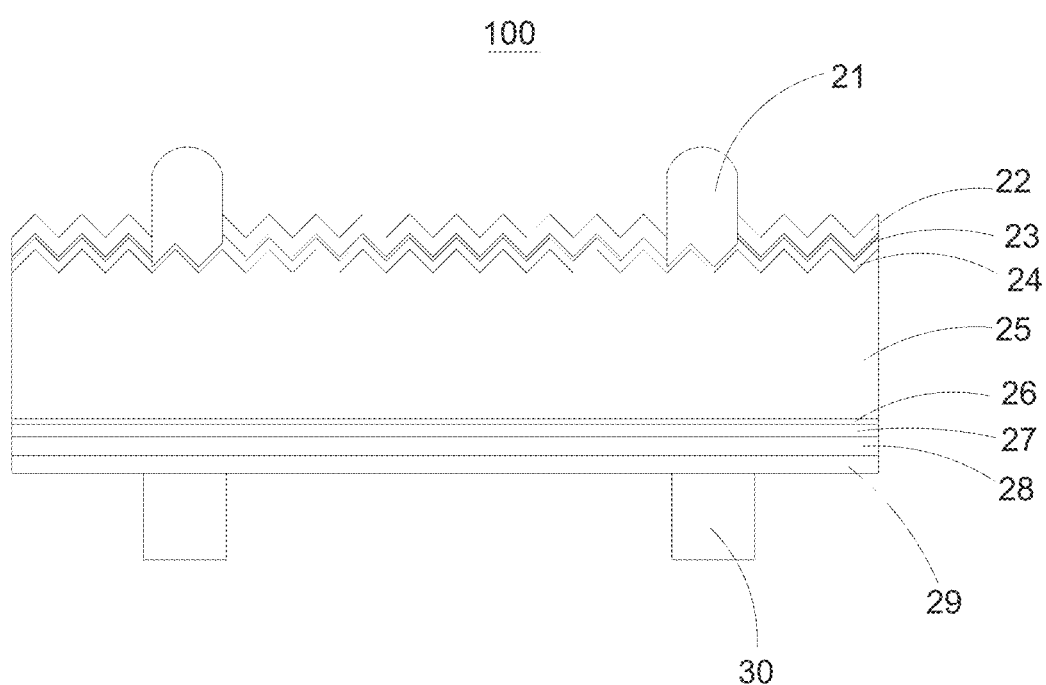
FIG. 2 is a schematic view of a double-sided solar cell according to the present application.

As shown in FIGS. 1 and 2, a preparation method for a double-sided solar cell 100 includes the following steps.

At S1, a semi-finished product 10 of the double-sided solar cell 100 is prepared. The semi-finished product 10 includes a silicon wafer 25; and a P-type doped layer 24, a front passivation layer 23, and a front anti-reflection layer 22 that are sequentially formed on a front surface of the silicon wafer 25.

In addition to the above-mentioned front structures, the semi-finished product 10 further includes a back structure. The back structure includes a tunnel oxide layer 26, an intrinsic polysilicon layer 27, a doped polysilicon layer 28, and a back anti-reflection layer 29 that are sequentially formed on a back surface of the silicon wafer 25.

The above semi-finished product 10 of the double-sided solar cell 100 can be prepared by oneself, and for the preparation method for each of the layers, reference may be made to the related art, which is not limited herein.

Optionally, the double-sided solar cell 100 is a TOPCon double-sided solar cell.

The silicon wafer 25 may be a P-type silicon wafer 25 or an N-type silicon wafer 25.

In some optional embodiments, in order to make the double-sided solar cell have higher efficiency, the silicon wafer 25 is an N-type silicon wafer 25.

The front passivation layer 23 includes but is not limited to a silicon dioxide layer, and may also be an aluminum oxide layer, etc.

In some optional embodiments, the front passivation layer 23 is an aluminum oxide layer. The aluminum oxide layer can be grown on a surface of the P-type doped layer 24 using different deposition methods such as AlD, PEALD, PECVD, etc. The surface of the P-type doped layer 24 refers to a surface thereof away from silicon wafer 25.

Optionally, a thickness of the aluminum oxide layer is in a range from 2 nm to 15 nm.

The front anti-reflection layer 22 includes but is not limited to a silicon nitride layer, and may also be a magnesium fluoride layer.

In some optional embodiments, the front anti-reflective layer 22 is a silicon nitride layer.

The silicon nitride layer can have a single-layer structure or a multi-layer structure, specifically including but not limited to a SiNx single-layer structure, a SiNx/SiOxNy multi-layer structure, or a SiNx/SiOxNy/SiOx multi-layer structure, which can be selected by those skilled in the art according to actual needs.

A thickness of the front anti-reflection layer 22 is in a range from 50 nm to 120 nm. Within this thickness range, the anti-reflection requirements of the double-sided solar cell 100 can be met.

At S2, an opening 11 corresponding to a front finger is provided on the front surface of the semi-finished product 10. The opening 11 extends through the front anti-reflection layer 22 and the front passivation layer 23 in sequence and exposes the surface of the P-type doped layer 24.

The above opening 11 is used to expose the surface of the P-type doped layer 24, so that a coated silver-containing paste can be in a direct contact with the surface of the P-type doped layer 24 in the subsequent step S3, thereby reducing the contact resistance.

The opening 11 corresponding to the front finger may be provided on the front surface of the semi-finished product 10 in various ways, and which may be selected by those skilled in the art according to actual needs.

In some optional embodiments, the step of providing the opening 11 corresponding to the front finger on the front surface of the semi-finished product 10 includes: providing the opening 11 on the front surface of the semi-finished product 10 using laser ablation. The above laser ablation is simple to operate, so that the opening 11 can be quickly prepared, thereby improving the production efficiency.

It can be understood that during the laser ablation process, the P-type doped layer 24 should be avoided from being ablated. In actual use, the type, wavelength, and power of the laser used can be selected according to actual needs; the laser spot used can have a circular shape with spot energy dispersed, or can have a square shape with uniform spot energy; and the spacing between any two adjacent light spots can also be selected according to actual needs, and which are not limited herein.

Since the width of the front finger is small, in some optional embodiments, the size of the laser spot used for laser ablation is greater than 0 μm and no more than 60 μm. The size of above laser spot is selected reasonably, which can avoid excessive width of the opening 11 caused by excessive size of the laser spot, and thus avoid excessive exposure of the P-type dopant layer 24, which in turn avoids low conversion efficiency of the double-sided solar cell 100.

In some optional embodiments, the step of providing the opening 11 corresponding to the front finger on the front surface of the semi-finished product 10 includes: forming a patterned anti-acid-corrosion mask layer on a surface of the front anti-reflection layer 22. A portion of the anti-acid-corrosion mask layer corresponding to the front finger is provided with a hollow portion exposing the front anti-reflective layer 22. After acid etching portions of the front anti-reflective layer 22 and the front passivation layer 23 corresponding to the hollow portion, the anti-acid-corrosion mask layer is removed.

The surface of the front anti-reflection layer 22 refers to a surface thereof away from the silicon wafer 25.

The above-mentioned method of preparing the opening 11 by using the anti-acid-corrosion mask layer is simple to operate, convenient for industrial production, thereby effectively improving production efficiency.

Optionally, the acid used for acid etching is hydrofluoric acid, and the anti-acid-corrosion mask layer can be made of paraffin, which is convenient to be removed in subsequent process, and can effectively avoid contamination caused by its residue on the surface of the front anti-reflective layer 22.

In some optional embodiments, the step of providing the opening 11 corresponding to the front finger on the front surface of the semi-finished product 10 includes: printing an etching paste on a portion of the surface of the front anti-reflection layer 22 corresponding to the front finger. This operation method is simple and controllable, and effectively improves production efficiency.

Optionally, the etching paste contains hydrofluoric acid.

At S3, a non-fire-through paste in contact with the P-type doped layer 24 is coated through the opening 11, and is sintered to form the front finger.

Since the opening 11 extends through the front passivation layer 23 and the front anti-reflection layer 22 and exposes the surface of the P-type doped layer 24, the non-fire-through paste is printed to be in a direct contact with the P-type doped layer 24, thereby reducing the contact resistance. In addition, since the non-fire-through paste does not contain excessive glass powder, the pn junction will not be damaged, which can effectively reduce metal recombination, increase the open circuit voltage of the double-sided solar cell 100 and improve the conversion efficiency of the double-sided solar cell 100.

The non-fire-through paste refers to a paste that contains less glass powder than conventional pastes. This paste has weak fire-through ability during the sintering process, so that the front passivation layer 23 and the front anti-reflection layer 22 may not be fired through. Optionally, the non-fire-through paste contains a glass powder with a mass percentage greater than 0 and no more than 1.5%. For example, the non-fire-through paste contains a glass powder with a mass percentage of 0.1%, 0.3%, 0.5%, 0.7%, 1%, 1.3%, 1.5%.

The non-fire-through pastes include, but are not limited to, silver paste or silver-aluminum paste.

In some optional embodiments, the non-fire-through paste is a silver-aluminum paste, which refers to a metal paste containing silver and aluminum for forming electrodes. The above silver-aluminum paste has high conversion efficiency. By adopting the above method, an aluminum pin can be pinned into the silicon wafer 25 instead of forming an aluminum-silicon alloy, which can further reduce the contact barrier and improve the conversion efficiency of the double-sided solar cell 100.

It should be noted that the specific ingredients of the silver-aluminum paste include silver powder, aluminum powder, glass powder and organic carrier. For specific ingredients of the silver-aluminum paste, reference may be made to related arts, and which are not limited herein.

Before coating the silver-containing paste, the preparation method further includes: firstly, screen-printing a back busbar and a back finger on a surface of the back anti-reflection layer 29 (that is, a surface of the back anti-reflection layer 29 away from the silicon wafer 25), followed by drying to form a back electrode 30, and then turning the front surface upward by using a flipping mechanism to form a front busbar on the surface of the front anti-reflection layer 22. The front busbar and the front finger constitute front electrode 21.

It should be noted that the front busbar can be prepared by the above preparation method for the front finger, or it can be prepared by performing screen printing on the surface of the front anti-reflection layer 22 and drying, and which can be selected by those skilled in the art according to actual needs.

Referring to FIG. 2, the present application further provides a double-sided solar cell 100. The double-sided solar cell 100 is prepared by the above preparation method.

Specifically, the double-sided solar cell 100 includes: a silicon wafer 25; and a P-type doped layer 24, a front passivation layer 23, a front anti-reflection layer 22, and a front electrode 21 that are sequentially formed on a front surface of the silicon wafer 25. The double-sided solar cell 100 is provided with an opening that sequentially extends through the front anti-reflection layer 22 and the front passivation layer 23 and exposes the surface of the P-type doped layer 24. The front electrode 21 includes a front finger. The front finger is formed in the opening and in an ohmic contact with the P-type doped layer 24. The front finger is a non-fire-through front finger. The non-fire-through finger refers to a finger obtained by sintering a non-fire-through paste.

The front electrode 21 includes a front busbar connected to the front finger. In addition, the double-sided solar cell 100 includes a tunnel oxide layer 26, an intrinsic polysilicon layer 27, a doped polysilicon layer 28, a back anti-reflection layer 29, and a back electrode 30 that are sequentially formed on a back surface of the silicon wafer 25. The back electrode 30 includes a back busbar and a back finger. That is, the double-sided solar cell 100 is a TOPCon double-sided solar cell.

Optionally, the front finger protrudes from the surface of the front anti-reflection layer 22. That is, the thickness of the front finger is greater than the total thickness of the front passivation layer 23 and the front anti-reflection layer 22.

Optionally, the front finger is made from a silver-aluminum paste containing a glass powder with a mass content greater than 0 and no more than 1.5%, that is, the front finger is a silver-aluminum grid, and the aluminum pin in the front finger is pinned into the silicon wafer 25.

The double-sided solar cell and the preparation method thereof according to the present application will be described in further detail below with reference to examples.

Example 1

A preparation method for the TOPCon double-sided solar cell as shown in FIG. 1 includes the following steps.

(1) A semi-finished product 10 as shown in FIG. 2 was prepared. The semi-finished product 10 includes: an N-type silicon wafer 25; a P-type doping layer 24 with a thickness of 1 μm, a front passivation layer ($Al_2O_3$ layer) 23 with a thickness of 5 nm, and a front anti-reflection layer ($Si_3N_4$ layer) 22 with a thickness of 72 nm, that are sequentially formed on a front surface of the N-type silicon wafer 25; and an tunnel oxide layer ($SiO_2$) 26 with a thickness of 1 nm, an intrinsic polysilicon layer 27 with a thickness of 15 nm, a doped polysilicon layer 28 with a thickness of 120 nm, a back anti-reflection layer ($Si_3N_4$ layer) 29 with a thickness of 75 nm, that are formed on a back surface of the N-type silicon wafer 25.

A laser device was used to perform laser ablation on a portion of the surface of the front anti-reflection layer 22 corresponding to the front finger to form an opening 11. The opening 11 sequentially extends through the front anti-reflection layer 22 and the front passivation layer 23 and exposes a surface of the P-type doped layer 24. The laser spot was a circular spot. A size of a single spot was 55 μm. The laser device adopted a picosecond laser, had the power set to 10 W, and a real-to-imaginary ratio of laser grooving was set to 3:1.

(2) A back silver busbar and a back silver finger were screen-printed on a surface of the back anti-reflection layer 29 and dried, and a flipping mechanism was used to turn the front surface of the semi-finished product 10 upward.

(3) A front silver busbar was screen-printed on a front surface of the semi-finished product 10 and dried. A silver-aluminum paste was precisely printed into the opening 11 to form a paste finger. The silver-aluminum paste herein was a semi-fire-through paste containing a glass powder with a mass content of 1.5%. After printing, a height of the paste finger was 10 μm.

(4) Sintering was performed in a sintering furnace at 760° C. so that the paste finger was formed into the back finger.

Example 2

The differences between Example 2 and Example 1 are only as follows.

The parameters of laser in step (1) are different. A laser device was used to perform laser ablation on a portion of the surface of the front anti-reflection layer corresponding to the front finger to form an opening. The opening sequentially extends through the front anti-reflection layer and the front passivation layer and exposes a surface of the P-type doped layer. The laser spot was a circular spot. A size of a single spot was 60 μm. The laser device adopted a picosecond laser, had the power set to 10 W, and a laser grooving was performed by a continuous spot (no dotted line).

The mass content of glass powder in the silver-aluminum paste in step (3) was 0.8%.

Example 3

The differences between Example 3 and Example 2 are only as follows.

(1) A semi-finished product was prepared. The semi-finished product 10 includes: an N-type silicon wafer 25; a P-type doping layer 24 with a thickness of 1 μm, a front passivation layer ($Al_2O_3$ layer) 23 with a thickness of 5 nm, and a front anti-reflection layer ($Si_3N_4$ layer) 22 with a thickness of 72 nm, that are sequentially formed on a front surface of the N-type silicon wafer 25; and an tunnel oxide layer ($SiO_2$) 26 with a thickness of 1 nm, an intrinsic polysilicon layer 27 with a thickness of 15 nm, a doped polysilicon layer 28 with a thickness of 120 nm, a back anti-reflection layer 29 ($Si_3N_4$ layer) with a thickness of 75 nm, that are formed on a back surface of the N-type silicon wafer 25.

A front screen mask and a back screen mask were prepared. The front screen mask had a patterned region that corresponds to the front finger and is impermeable to a paste. The remaining portions of the front screen mask can allow the paste to pass through. The back screen mask can allow the paste to pass through.

The front screen mask was used to print acid-resistant paste containing paraffin on a surface of the front anti-reflective layer, and the back screen mask was used to print acid-resistant paste containing paraffin on a surface of the back anti-reflective layer, and then drying was performed at 150° C. Then, the front screen mask and the back screen mask were removed, so that a semi-finished product in which a patterned anti-acid-corrosion mask layer was formed on a surface of the front anti-reflective layer, and a complete, unpatterned anti-acid-corrosion mask layer was formed on a surface of the back anti-reflective layer, was formed. A portion of the anti-acid-corrosion mask layer with its front surface patterned, corresponding to the front finger had a hollow portion exposing the front anti-reflection layer.

Cleaning acid was formulated in a tank cleaning machine according to the volume ratio of deionized water:HF=10:3. The above semi-finished product with the anti-acid-corrosion mask layer was placed into a pickling tank and soaked for 20 min, to acid etch portions of the front anti-reflection layer and the front passivation layer corresponding to the hollow portion. The residual acid on the semi-finished product was washed away with deionized water.

Then, a mixed aqueous solution (containing 1% sodium hydroxide and 3% hydrogen peroxide by mass percentage) was used to remove the anti-acid-corrosion mask layer on the front surface and the back surface of the semi-finished product, followed by washing, and drying.

Example 4

The differences between Example 4 and Example 2 are only as follows.

(1) A front screen mask was prepared. The front screen mask had a patterned region that corresponds to a front finger and allow a paste to pass through. The remaining portions of the front screen mask was impermeable to the paste. The front screen mask was used to print a fluorine-containing corrosion paste on a surface of the front anti-reflective layer, so that laser ablation was performed on a portion of the surface of the front anti-reflection layer corresponding to the front finger to form an opening. The opening sequentially extends through the front anti-reflection layer 22 and the front passivation layer and exposes a surface of the P-type doped layer.

Then, a mixed aqueous solution (containing 1% sodium hydroxide and 3% hydrogen peroxide by mass percentage) was used to remove the fluorine-containing corrosion paste printed on the surface of the semi-finished product, followed by washing and drying.

Comparative Example 1

The difference between Comparative Example 1 and Example 1 is only as follows. No opening was provided in step (1), and the finger was directly screen-printed on the front surface of the semi-finished product in step (3).

Comparative Example 2

The difference between Comparative Example 2 and Example 2 is only as follows.

In step (3), the mass content of glass powder in the silver-aluminum paste was 2%.

Test Example 1

The TOPCon double-sided solar cells prepared in Examples 1-4 and Comparative Examples 1-2 were tested in the same manner, and the results are shown in Table 1.

In Table 1, BL indicates that the only differences between the corresponding Groups lies in that no opening is provided and the silver-aluminum paste having a glass powder with a mass content of 3% is used. The sample indicates the TOPCon double-sided solar cells prepared by the corresponding Groups. The difference value refers to the difference between the TOPCon double-sided solar cell prepared by each of Groups and the corresponding BL.

TABLE 1

| | | | | | | | | |
|---|---|---|---|---|---|---|---|---|
| | | | | | Test Results | | | |
| | Group | Eta(%) | Uoc(V) | Isc(A) | FF(%) | Rs($\Omega$) | Rsh($\Omega$) | IRev2(A) |
| Example 1 | BL | 24.70 | 0.712 | 18.328 | 83.43 | 0.00075 | 1491 | 0.10 |
| | Test | 24.81 | 0.714 | 18.331 | 83.55 | 0.00071 | 1329 | 0.17 |
| | Difference value | 0.11 | 0.002 | 0.003 | 0.12 | −0.00004 | −162 | 0.07 |
| Example 2 | BL | 24.67 | 0.711 | 18.355 | 83.35 | 0.00077 | 1315 | 0.10 |
| | Test | 24.78 | 0.713 | 18.353 | 83.43 | 0.00073 | 1453 | 0.17 |
| | Difference value | 0.10 | 0.002 | −0.002 | 0.08 | −0.00004 | 138 | 0.07 |
| Example 3 | BL | 24.73 | 0.713 | 18.312 | 83.50 | 0.00071 | 1673 | 0.10 |
| | Test | 24.84 | 0.715 | 18.320 | 83.61 | 0.00068 | 1763 | 0.17 |
| | Difference value | 0.11 | 0.002 | 0.008 | 0.11 | −0.00003 | 90 | 0.07 |
| Example 4 | BL | 24.67 | 0.712 | 18.311 | 83.39 | 0.00076 | 1537 | 0.10 |
| | Test | 24.77 | 0.714 | 18.315 | 83.50 | 0.00069 | 1603 | 0.17 |
| | Difference value | 0.10 | 0.002 | 0.004 | 0.11 | −0.00007 | 66 | 0.07 |
| Comparative Example 1 | BL | 24.64 | 0.711 | 18.314 | 83.40 | 0.00070 | 1341 | 0.10 |
| | Test | 24.12 | 0.712 | 18.321 | 81.55 | 0.00101 | 1574 | 0.17 |
| | Difference value | −0.52 | 0.001 | 0.007 | −1.85 | 0.00031 | 233 | 0.07 |

TABLE 1-continued

<table>
<tr><th colspan="2">Group</th><th colspan="7">Test Results</th></tr>
<tr><th colspan="2"></th><th>Eta(%)</th><th>Uoc(V)</th><th>Isc(A)</th><th>FF(%)</th><th>Rs(Ω)</th><th>Rsh(Ω)</th><th>IRev2(A)</th></tr>
<tr><td>Comparative</td><td>BL</td><td>24.69</td><td>0.712</td><td>18.295</td><td>83.57</td><td>0.00065</td><td>1237</td><td>0.10</td></tr>
<tr><td>Example 2</td><td>Test</td><td>24.57</td><td>0.708</td><td>18.289</td><td>83.68</td><td>0.00073</td><td>929</td><td>0.17</td></tr>
<tr><td></td><td>Difference value</td><td>−0.11</td><td>−0.004</td><td>−0.006</td><td>0.11</td><td>0.00008</td><td>−308</td><td>0.07</td></tr>
</table>

It can be seen from Table 1 that the preparation method adopted in this application can effectively improve the conversion efficiency of TOPCon double-sided solar cells compared with Comparative Example 1 and Comparative Example 2.

The technical features of the above-described embodiments can be combined in any way. To simplify the description, not all possible combinations of the technical features in the above-described embodiments are described. However, as long as there is no contradiction in the combination of these technical features, all should be considered to be within the scope of this description.

The above-mentioned embodiments only illustrate several examples of the present application, and their descriptions are relatively specific and detailed, but they should not be construed as limiting the scope of the patent application. It should be noted that, for those of ordinary skill in the art, several modifications and improvements can be made without departing from the concept of the present application, and these all fall within the protection scope of the present application. Therefore, the protection scope of this patent application shall be subjected to the appended claims.

The invention claimed is:

1. A preparation method for a double-sided solar cell, comprising the following steps:
   preparing a semi-finished product of the double-sided solar cell, the semi-finished product comprising: a silicon wafer; and a P-type doped layer, a front passivation layer, and a front anti-reflection layer that are sequentially formed on a front surface of the silicon wafer;
   providing an opening corresponding to a front finger on a front surface of the semi-finished product, the opening extending through the front anti-reflection layer and the front passivation layer in sequence and exposing a surface of the P-type doped layer; and
   coating a non-fire-through paste in contact with the P-type doped layer through the opening, sintering the paste to form the front finger, wherein an aluminum pin in the front finger is pinned into the silicon wafer,
   wherein the non-fire-through paste comprises a silver-aluminum paste containing a glass powder with a mass content greater than 0.8% and no more than 1.5%.

2. The preparation method according to claim 1, wherein the double-sided solar cell is a TOPCon double-sided solar cell.

3. The preparation method according to claim 1, wherein the step of providing the opening corresponding to the front finger on the front surface of the semi-finished product comprises: providing the opening on the front surface of the semi-finished product using laser ablation.

4. The preparation method according to claim 3, wherein a size of a laser spot used in the laser ablation is greater than 0 and no more than 60 μm.

5. The preparation method according to claim 1, wherein the step of providing the opening corresponding to the front finger on the front surface of the semi-finished product comprises:
   forming a patterned anti-acid-corrosion mask layer on a surface of the front anti-reflection layer, a portion of the anti-acid-corrosion mask layer corresponding to the front finger being provided with a hollow portion exposing the front anti-reflective layer;
   acid etching the front anti-reflective layer and the front passivation layer corresponding to the hollow portion; and
   removing the anti-acid-corrosion mask layer.

6. The preparation method according to claim 1, wherein the step of providing the opening corresponding to the front finger on the front surface of the semi-finished product comprises:
   printing an etching paste on a portion of a surface of the front anti-reflection layer corresponding to the front finger.

7. The preparation method according to claim 1, wherein the silicon wafer is an N-type silicon wafer.

8. The preparation method according to claim 1, wherein the front anti-reflection layer comprises a silicon nitride layer or a silicon dioxide layer.

9. The preparation method according to claim 1, wherein the front passivation layer comprises an aluminum oxide layer or a magnesium fluoride layer.

10. A double-sided solar cell, comprising:
    a silicon wafer; and
    a P-type doped layer, a front passivation layer, a front anti-reflection layer, and a front electrode that are sequentially formed on a front surface of the silicon wafer,
    wherein the double-sided solar cell is provided with an opening that sequentially extends through the front anti-reflection layer and the front passivation layer and exposes a surface of the P-type doped layer; the front electrode comprises a front finger; the front finger is formed in the opening and in an ohmic contact with the P-type doped layer; and the front finger is a non-fire-through front finger,
    wherein the front finger is made from a silver-aluminum paste containing a glass powder with a mass content greater than 0.8% and no more than 1.5%, and an aluminum pin in the front finger is pinned into the silicon wafer.

* * * * *